(12) United States Patent
Kim et al.

(10) Patent No.: US 7,553,771 B2
(45) Date of Patent: Jun. 30, 2009

(54) METHOD OF FORMING PATTERN OF SEMICONDUCTOR DEVICE

(75) Inventors: Seo Min Kim, Seoul (KR); Chang Moon Lim, Icheon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 40 days.

(21) Appl. No.: 11/947,228

(22) Filed: Nov. 29, 2007

(65) Prior Publication Data
US 2008/0286954 A1 Nov. 20, 2008

(30) Foreign Application Priority Data
May 14, 2007 (KR) ...................... 10-2007-0046693

(51) Int. Cl.
*H01L 21/302* (2006.01)
*H01L 21/461* (2006.01)
(52) U.S. Cl. .................. 438/705; 438/715; 438/924; 257/E21.026; 257/E21.039
(58) Field of Classification Search .............. 438/705, 438/715, 924, 945, 947, 950; 257/E21.024, 257/E21.026, E21.032, E21.033, E21.035, 257/E21.039, E21.038
See application file for complete search history.

(56) References Cited

U.S. PATENT DOCUMENTS 7,229,928 B2 * 6/2007 Baier .......................... 438/705
7,316,978 B2 * 1/2008 Lee et al. .................... 438/703
2002/0001960 A1 * 1/2002 Wu et al. .................... 438/705
2002/0160619 A1 * 10/2002 Yamada et al. .............. 438/723
2005/0106890 A1 * 5/2005 Schroeder et al. ........... 438/719

FOREIGN PATENT DOCUMENTS

JP 63-043320 2/1988
KR 10-1997-23809 5/1997

OTHER PUBLICATIONS

Korean Intellectual Property Office Notice of Rejection for Application No. 10-2007-0046693, dated Jul. 30, 2008.

* cited by examiner

*Primary Examiner*—Caridad M Everhart
(74) *Attorney, Agent, or Firm*—Marshall, Gerstein & Borun LLP

(57) ABSTRACT

A method of forming a pattern of a semiconductor device comprises forming a first hard mask film, a first resist film, and a second hard mask film over an underlying layer of a semiconductor substrate; forming a second resist pattern over the second hard mask film; etching the second hard mask film using the second resist pattern as an etching mask to form a second hard mask pattern; performing an ion-implanting process on the first resist film with the second hard mask pattern as an ion implanting mask to form an ion implanting layer in a portion of the first resist film, and selectively etching the first resist film with the second hard mask pattern and an ion implanting layer as an etching mask to form a first resist pattern.

11 Claims, 4 Drawing Sheets

METHOD OF FORMING PATTERN OF SEMICONDUCTOR DEVICE

CROSS-REFERENCE TO RELATED APPLICATION

The priority of Korean patent application number 10-2007-0046693, filed on May 14, 2007, the disclosure of which is incorporated by reference in its entirety, is claimed.

BACKGROUND OF THE INVENTION

The invention relates generally to a method of forming a pattern of a semiconductor device and, more specifically, to a method of forming a pattern of a semiconductor device which comprises forming a relatively small pattern in comparison with conventional resolution by a double patterning method using an ion implanting process.

Conventional double patterning is typically carried out by one of two methods.

The first method includes twice forming a line/space pattern with a line/space ratio of 1:3, which has a double (2:1) pitch. Since overlay affects the critical dimension (CD) in the first method, it is necessary to accurately regulate overlay in order to secure desirable CD uniformity.

The second method includes forming a line/space pattern with a line/space ratio of 1:3, forming a spacer at a sidewall of the line pattern, and forming a desired pattern using the spacer as a hard mask. Alternatively, the second method includes forming a line/space pattern with a line/space ratio of 1:3, forming a spacer at a sidewall of the line pattern, depositing another material over the spacer, and removing the spacer to obtain a desired pattern. CD regulation is also affected by overlay in this method; when the spacer is not vertical, the etched profile is inferior.

SUMMARY OF THE INVENTION

Various embodiments of the invention are directed at providing a method of forming a pattern of a semiconductor device which comprises forming a relatively small pattern in comparison with conventional resolution by a double patterning method using an ion implanting process.

According to one embodiment of the invention, a method of forming a pattern of a semiconductor device comprises: forming a first hard mask film, a first resist film, and a second hard mask film over an underlying layer of a semiconductor substrate; forming a second resist pattern over the second hard mask film; etching the second hard mask film using the second resist pattern as an etching mask to form a second hard mask pattern; performing an ion-implanting process on the first resist film with the second hard mask pattern as an ion implanting mask to form an ion implanting layer in a portion of the first resist film; and selectively etching the first resist film with the second hard mask pattern and an ion implanting layer as an etching mask to form a first resist pattern.

The ion-implanting process is performed by slant ion-implanting process.

The first hard mask film preferably comprises a polysilicon film or a nitride film.

The second hard mask film preferably comprises an oxide film or a nitride film.

The second hard mask film preferably has a thickness ranging from 0.02 μm to 0.2 μm.

The second resist pattern preferably has a ratio of line pattern to space pattern of 1 to 3.

The ion implanting process is preferably performed with an ion implanting source including phosphorus or boron with an implanting amount ranging from $1e^{10}$ to $1e^{18}$ and energy ranging from 8 KeV to 40 KeV.

The ion implanting process is preferably controlled by changing at least one of an implanting frequency and an implanting angle.

The pitch between the first resist pattern and the second resist pattern is one-half of the pitch between the second resist patterns.

The first resist pattern is preferably formed by selectively etching the first resist film with an $O_2$ plasma.

The underlying layer preferably comprises a metal film or an interlayer insulating film.

DETAILED DESCRIPTION OF THE SPECIFIC EMBODIMENT

FIGS. 1a through 1g are cross-sectional diagrams illustrating a method of forming a pattern of a semiconductor device according to an embodiment of the invention.

Figure 1A:
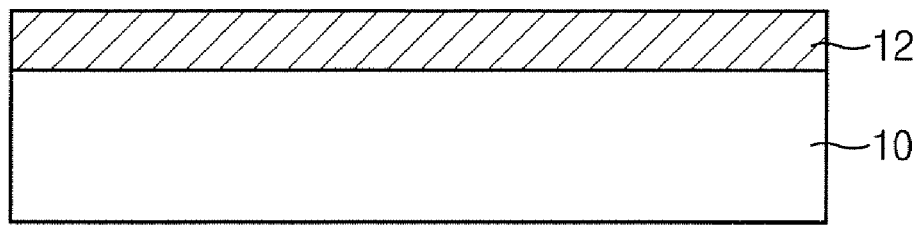
FIGS. 1a through 1g are cross-sectional diagrams illustrating a method of forming a pattern of a semiconductor device according to an embodiment of the invention.

Referring to FIG. 1a, a film, preferably a polysilicon film or a nitride film, is deposited over an underlying layer (not shown) of a semiconductor substrate 10 to form a first hard mask film 12. The underlying layer preferably comprises a metal film or an interlayer insulating film.

Figure 1B:
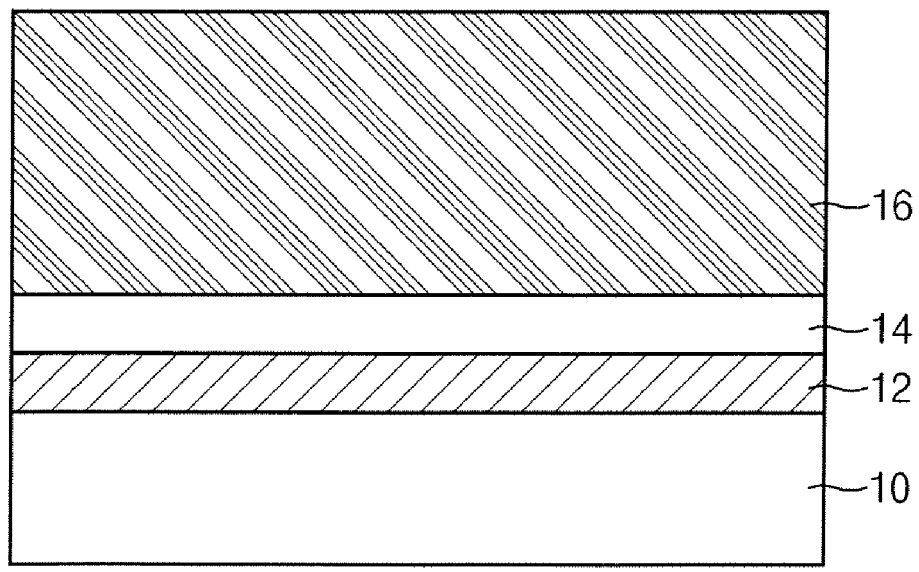

Referring to FIG. 1b, an i-line resist composition, illustratively having a 365 nm wavelength, is coated over the first hard mask film 12 to form a first resist film 14.

A film, preferably an oxide film or a nitride film, is deposited over the first resist film 14 to form a second hard mask film 16.

The thickness of the second hard mask film 16 is determined in consideration of a subsequent ion implanting process. The thickness of the second hard mask film 16 preferably ranges from 0.02 μm to 0.2 μm. An ion implanting angle and/or implanting frequency can be regulated in the subsequent ion implanting process so that the distribution of ions can be controlled.

Figure 1C:
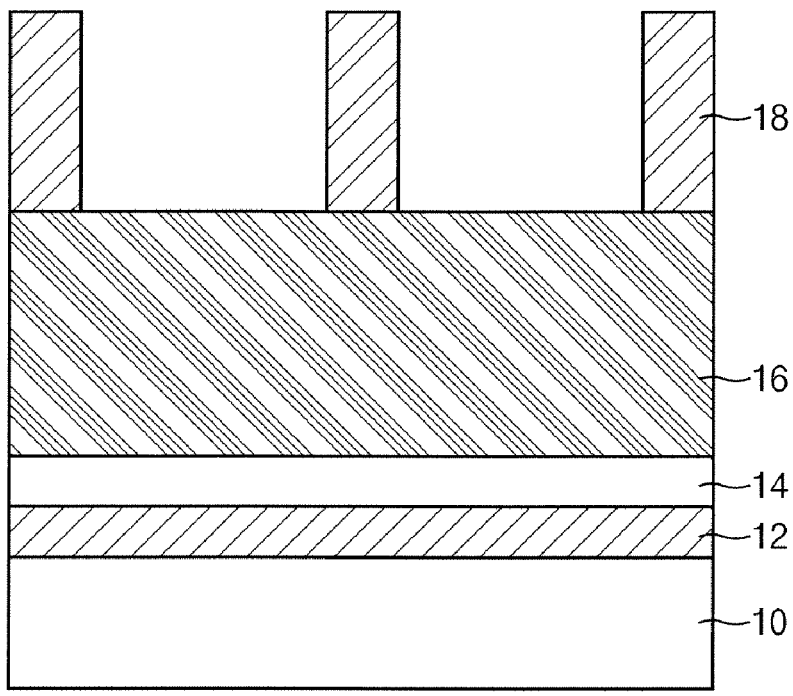

Referring to FIG. 1c, a resist composition, illustratively an ArF resist composition having a 193 nm wavelength, is coated over the second hard mask film 16 to form a second resist film (not shown). A suitable process, preferably a photo etching process, is performed with an exposure mask (not shown) to selectively etch the second resist film, thereby obtaining a second resist pattern 18 preferably including a line pattern and a space pattern preferably with a line/space ratio of 1:3.

Figure 1D:
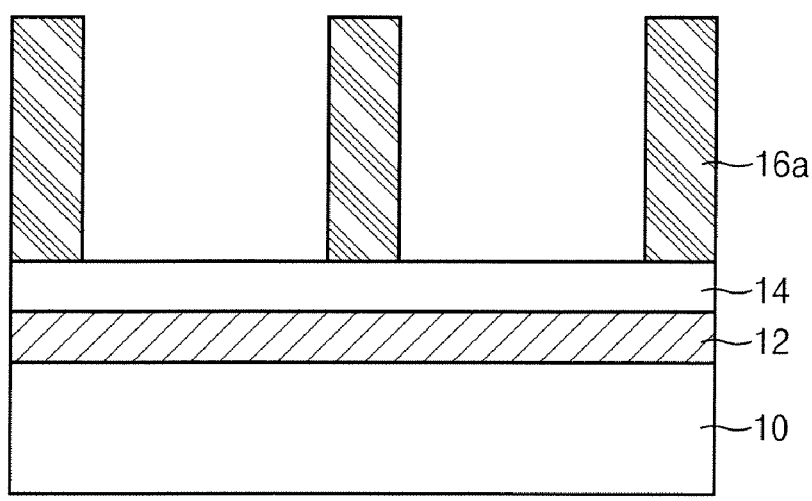

Referring to FIG. 1d, the second hard mask film 16 is etched with the second resist pattern 18 as an etching mask to form a second hard mask pattern 16a including a line pattern and a space pattern preferably with a line/space ratio of 1:3.

The residual second resist pattern 18 is preferably removed with an $O_2$ plasma.

Figure 1E:
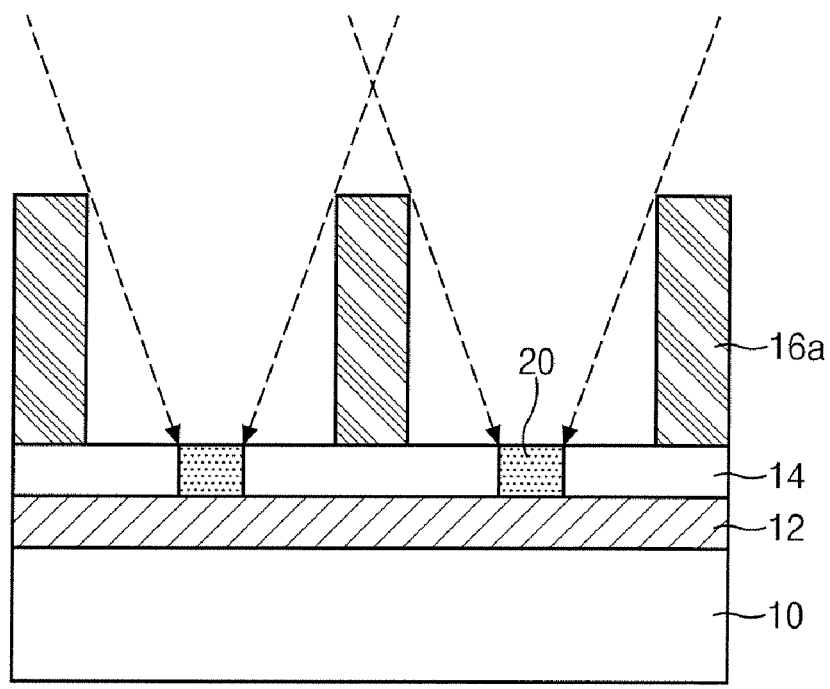

Referring to FIG. 1e, a slope ion implanting process is performed on the first resist film 14 with a selected angle using the second hard mask pattern 16a as an ion implanting mask to harden a part of the first resist film 14, thereby forming an ion implanting layer 20 in a portion of the first resist film 14. The implanted ion is preferably phosphorous or boron.

The first resist film 14 adjacent to the second hard mask pattern 16a is masked by the second hard mask pattern 16a so that the ion implantation in the regions to each of side the ion implanting layer 20 is minimized.

The ion implanting process is performed with an ion implanting source, preferably comprising phosphorus or boron, and preferably having an implanting amount ranging from $1e^{10}$ to $1e^{18}$ at an energy ranging from 8 KeV to 40 KeV. The ion is implanted in an amount sufficient that the ion implanting layer 20 is not removed in the etching process with the $O_2$ plasma or other suitable treatment.

The ion implanting process may be conveniently controlled by changing the implanting frequency or the ion implanting angle to regulate the ion distribution in the ion implanting layer 20.

For example, the ion implanting angle may be changed by 180° to the initial angle so that the distribution of the ion may be focused in the center.

In the ion implanting process, the second hard mask film 16 preferably has a thickness ranging from 0.02 μm to 0.2 μm so that the ion implanting angle and the ion implanting distribution can be regulated.

Figure 1F:
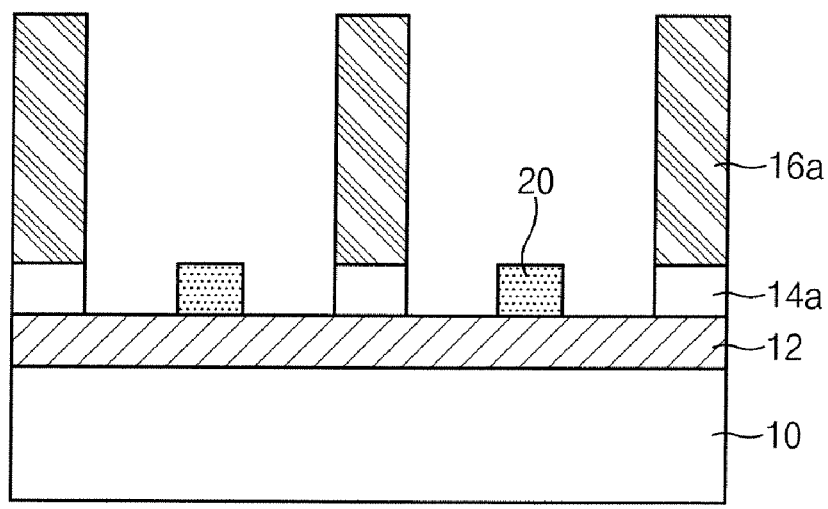

Referring to FIG. 1f, the first resist film 14 is removed, preferably with $O_2$ plasma using the second hard mask pattern 16a and the ion implanting layer 20 as an etching mask. Since the ion implanting layer 20 is not affected by the $O_2$ plasma, a first resist pattern 14a having a line type is formed.

When the pitch between the second resist patterns 18 (FIG. 1c) is designated "A", the pitch between the first resist pattern 14a and the second resist patterns 18 is preferably A/2 according to the invention.

The residual second hard mask pattern 16a and first resist pattern 14a are then removed, preferably with the $O_2$ plasma.

Figure 1G:
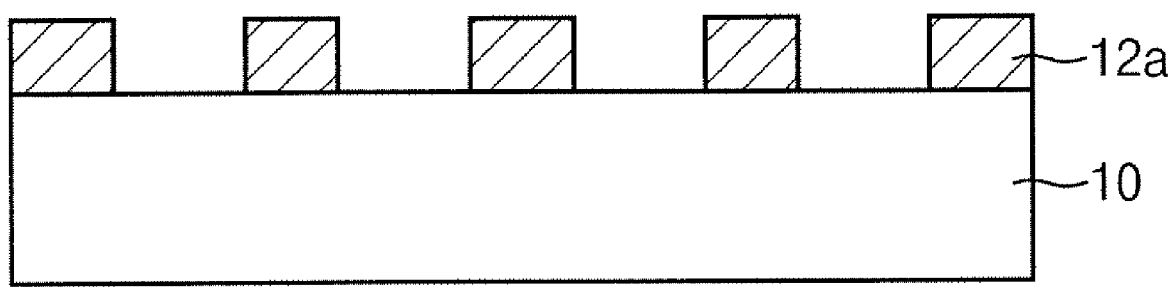

Referring to FIG. 1g, the first hard mask film 12 is etched with the ion implanting layer 20 as an etching mask so that a pitch between the resulting first hard mask patterns 12a is preferably A/2.

The underlying layer (not shown) of the semiconductor substrate is selectively etched with the first hard mask pattern 12a as an etching mask, thereby obtaining, for example, a metal pattern or an interlayer insulating pattern with a reduced pitch, preferably A/2.

Thus, it is possible to reduce the size of the pattern when an underlying interlayer insulating film is patterned or a metal pattern is formed, for example.

As described above, according to an embodiment of the invention, a method of forming a pattern of a semiconductor device can prevent non-uniformity of CD due to overlays in a double patterning method for forming a pattern, and remove defects of profiles when a spacer is not vertical. As a result, it is possible to form a fine pattern having a resolution size smaller than that of a conventional resolution.

The described embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of forming a pattern of a semiconductor device, the method comprising:
   forming a first hard mask film, a first resist film, and a second hard mask film over an underlying layer of a semiconductor substrate;
   forming a second resist pattern over the second hard mask film;
   etching the second hard mask film using the second resist pattern as an etching mask to form a second hard mask pattern;
   performing an ion-implanting process on the first resist film using the second hard mask pattern as an ion implanting mask to form an ion implanting layer in a portion of the first resist film; and
   selectively etching the first resist film using the second hard mask pattern and an ion implanting layer as an etching mask to form a first resist pattern.

2. The method according to claim 1, wherein the ion-implanting process is performed by slant ion-implanting process.

3. The method according to claim 1, wherein the first hard mask film comprises a polysilicon film or a nitride film.

4. The method according to claim 1, wherein the second hard mask film comprises an oxide film or a nitride film.

5. The method according to claim 1, wherein the second hard mask film has a thickness ranging from 0.02 μm to 0.2 μm.

6. The method according to claim 1, wherein the second resist pattern has a ratio of line pattern to space pattern of 1:3.

7. The method according to claim 1, wherein the ion implanting process is performed using an ion implanting source including phosphorus or boron having an implanting amount ranging from $1e^{10}$ to $1e^{18}$ and an implanting energy ranging from 8 KeV to 40 KeV.

8. The method according to claim 1, wherein the ion implanting process is controlled by changing at least one of an implanting frequency and an implanting angle.

9. The method according to claim 1, wherein a pitch between the second resist pattern is A, and a pitch between the first resist pattern and the second resist pattern is A/2.

10. The method according to claim 1, wherein the first resist pattern is formed by selectively etching the first resist film with an $O_2$ plasma.

11. The method according to claim 1, wherein the underlying layer is a metal film or an interlayer insulating film.

* * * * *